United States Patent [19]
Kamiyama et al.

[11] Patent Number: 5,462,634
[45] Date of Patent: Oct. 31, 1995

[54] SURFACE-TREATED ALUMINUM MATERIAL AND METHOD FOR ITS SURFACE TREATMENT

[75] Inventors: Shiro Kamiyama; Masanori Kosugi, both of Saitama; Masahiro Kurata; Sadao Shiraishi, both of Tokyo; Nobuyoshi Sasaki, Tokyo, all of Japan

[73] Assignees: Honda Giken Kogyo Kabushiki Kaisha; Sky Aluminium Co., Ltd., both of Tokyo, Japan

[21] Appl. No.: 381,408

[22] Filed: Jan. 31, 1995

Related U.S. Application Data

[62] Division of Ser. No. 183,757, Jan. 21, 1994, abandoned.

[51] Int. Cl.$^6$ ............................................. C23C 8/06
[52] U.S. Cl. ..................... 216/85; 148/272; 148/275; 148/626; 148/667; 216/101; 216/103
[58] Field of Search ........................ 156/667, 626.1, 156/656.1; 148/272, 275, 626; 216/101

[56] References Cited

U.S. PATENT DOCUMENTS

| | | | |
|---|---|---|---|
| 3,499,780 | 3/1970 | Etherington | 148/275 |
| 4,087,367 | 5/1928 | Rioult | 156/667 |
| 4,235,648 | 11/1980 | Richardson | 148/272 |
| 4,451,304 | 5/1984 | Batiuk | 148/215 |
| 4,477,290 | 10/1984 | Carrol | 148/275 |
| 4,614,607 | 9/1986 | Loch | 156/667 |
| 4,619,731 | 10/1986 | Buttry | 156/667 |

FOREIGN PATENT DOCUMENTS

| | | | |
|---|---|---|---|
| 474861 | 6/1968 | Canada | 148/275 |
| 50-86540 | 7/1975 | Japan . | |
| 0161071 | 12/1980 | Japan | 148/275 |
| 59-133382 | 7/1984 | Japan . | |
| 64-34731 | 2/1989 | Japan . | |
| 1-212775 | 8/1989 | Japan . | |
| 2-97700 | 4/1990 | Japan . | |
| 803405 | 10/1958 | United Kingdom . | |

*Primary Examiner*—Sam Silverberg
*Attorney, Agent, or Firm*—Burns, Doane, Swecker & Mathis

[57] ABSTRACT

An aluminum material is surface-treated with an aqueous solution containing 0.005 mol/lit. or more of a chelating agent and 5 g/lit. or more of an organic amine and having 100 ppm or less of phosphoric acid radical ion concentration and 500 ppm or less of sulfuric acid radical ion concentration, until its surface has a color tone (S) of:

$$S=(X^2+(3.388Z-3Y^2)^{1/2} \cong 70$$

wherein X, Y and Z represent the tristimulus values of color.

The aluminum material can be surface-treated while setting the treating conditions on the basis of a specific color tone detectable by colorimetry, without relying on experience and intuition. The surface-treated aluminum material can have a good anticorrosion, have good color change preventive properties, a good adhesion of coatings and a beautiful surface appearance. The present surface treatment is effective as anticorrosive treatment for itself, but can be also effective when this treatment is carried out as a pretreatment and further surface treatment is carried out thereon.

23 Claims, 1 Drawing Sheet

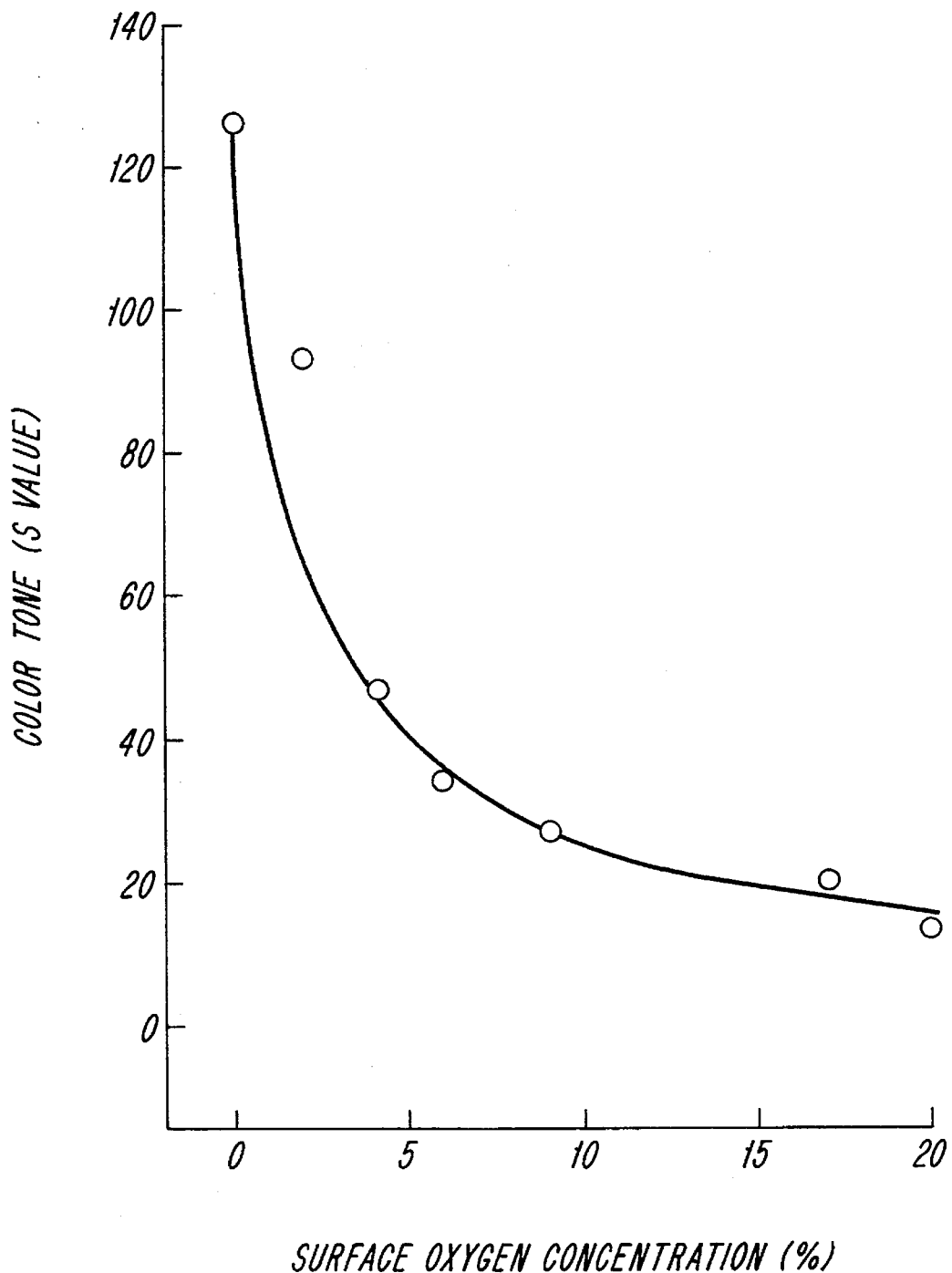

SURFACE-TREATED ALUMINUM MATERIAL AND METHOD FOR ITS SURFACE TREATMENT

This application is a divisional, of application No. 08/183,757, filed Jan. 21, 1994, now abandoned.

BACKGROUND OF THE INVENTION

1. Field of the Invention

This invention relates to a surface-treated aluminum or aluminum alloy material used in construction materials, heat-exchanger fin materials, printed circuit boards, can tub materials and other materials. It also relates to a method for its surface treatment.

2. Description of Related Art

A number of techniques have been proposed as methods for the surface treatment of aluminum or aluminum alloy materials for the purposes of anticorrosion, prevention of color changes, improvement in adhesion of coatings, appearance beautification and so forth.

Among them, relatively effective techniques can be chiefly exemplified by the following.

(1) Japanese Patent Laid-open No. 50-86540: An aluminum substrate is subbing-treated with an aqueous alkali silicate solution, and thereafter treated with a vinylidene chloride resin to form an anticorrosive coating.

(2) Japanese Patent Laid-open No. 64-34731: An aluminum sheet is pretreated with a weak alkali to degrease its surface, and thereafter treated in an aqueous solution containing an oxidizing agent to form a boehmite coating.

(3) Japanese Patent Laid-open No. 59-133382: An aqueous alkaline solution comprising about 3 to 6 g/lit. of a chelating agent is sprayed to carry out cleaning.

(4) Japanese Patent Laid-open No. 1-212775: Subbing treatment is applied by etching in an aqueous acidic solution of pH 2 or less containing chloride ions, followed by etching in an aqueous alkaline solution of pH 13 or more.

(5) Japanese Patent Laid-open No. 2-97700: Pretreatment for degreasing is applied in an aqueous solution to which a surface active agent has been added, and thereafter anodic polarization electrolysis and cathodic polarization electrolysis are alternately carried out. Every method, however, involves some problems.

The method (1) has the problem that the treatment tends to become uneven when the treatment with an alkali silicate is applied, making it difficult to obtain homogeneous coatings. In the method (2), probably because of the treatment for degreasing with a weak alkali, defective coatings and blackening may occur during the subsequent boehmite treatment and coating treatment, and such problems remain unsettled.

In the method (3), because of an unsatisfactory power for removing oxide layers by the aid of only a chelating agent, the blackening of material surfaces can not be completely avoided. The method (4) is a method capable of completely removing oxide layers, but requires two-stage treatment, which makes productivity poor to cause a cost increase. Moreover, because of smuts that may occur during the process, the problems of defective coatings and so forth may be caused in the subsequent coating and chemical conversion. The method (5) tends to give an unsatisfactory result on the degreasing pretreatment using the surface active agent, which causes unevenness in electrolysis. In this case, in order to obtain uniform treated surfaces, electric power is required in a large quantity, leading to a cost increase. This method has also the problem that it can not be applied to articles having complicated shapes, showing a difficulty in carrying out the surface treatment.

Difficulties such as poor anticorrosion, color changes, poor adhesion of coatings and so forth occurring in surface-treated aluminum materials are ascribable to a surface oxide layer. This surface oxide layer is thin, but is a porous layer containing a rolling oil or the like and has a large number of cracks, so that it has a poor wettability to coating materials to cause a poor adhesion of coatings and poor anticorrosion.

Any surface treatment carried out without complete removal of the surface oxide layer results in incorporation of components of this surface oxide layer into a hydrated oxide (boehmite) layer or an anodic oxide layer, so that a black or brown film is formed to cause damage of surface appearance. In the treatment by anodic oxidation or chemical conversion (chromating or the like), the dissolution of aluminum surface has influence on the initiation of film forming reaction, and hence any unhomogeneous oxide layer adhering to the surface causes non-uniform reaction, resulting in occurrence of defective coatings.

Thus, in order to obtain highly anticorrosive surface-treated aluminum materials having a beautiful surface appearance, any oxide layer produced during forging, rolling and forming must have been completely removed.

The extent to which this oxide layer has been removed can be measured by spectroscopic means such as EPMA (electron probe microanalysis) and ESCA (electron spectroscopy for chemical analysis) or measuring means such as SEM (scanning electron microscopy) and TEM (transmission electron microscopy). These, however, take time and labor, and moreover are not feasible for non-destructive measurement of the quantity of any remaining oxide layer except for small utensils. Accordingly, the setting of conditions for pretreatment has been hitherto often relied on experience and intuition, so that the treatment for the removal of oxide layers may be excessively carried out or, in reverse, the chemical conversion may be carried out without sufficient treatment for the removal of oxide layers, to often cause difficulties.

Thus, it is necessary to provide an index or guideline that enables simple measurement and also is precise. It, however, is not necessarily important to measure the quantity itself of a remaining oxide layer. After all, there may be at least a simple physical quantity that reflects the quantity of a remaining oxide layer.

SUMMARY OF THE INVENTION

Based on this concept, an object of the present invention is to provide a method for treating the surface of an surface-treated aluminum material, that can efficiently remove an oxide layer while simply judging the quantity of the remaining oxide layer and may have no influence on any subsequent surface treatment.

Another object of the present invention is to provide an aluminum material surface-treated to have a high anticorrosion and a beautiful surface appearance as a whole.

The present invention provides a surface-treated aluminum material comprising a surface having been treated with an aqueous solution containing a chelating agent and an organic amine, to have a color tone (S) of:

$$S = (X^2 + (3.388Z - 3Y^2))^{1/2} \geq 70$$

wherein X, Y and Z represent the tristimulus values of color.

The present invention also provides a method for treating the surface of an aluminum material, comprising subjecting the aluminum material to surface treatment with an aqueous solution containing 0.005 mol/lit. or more of a chelating agent and 5 g/lit. or more of an organic amine and having 100 ppm or less of phosphoric acid radical ion concentration and 500 ppm or less of sulfuric acid radical ion concentration; said treatment being carried out until the surface has a color tone (S) of:

$$S=(X^2+(3.388Z-3Y^2)^{1/2}\geq 70$$

wherein X, Y and Z represent the tristimulus values of color.

The present invention also provides a method for treating the surface of an aluminum material, comprising subjecting the aluminum material to surface treatment with an aqueous solution containing 0.005 mol/lit. or more of a chelating agent and 5 g/lit. or more of an organic amine and having 100 ppm or less of phosphoric acid radical ion concentration and 500 ppm or less of sulfuric acid radical ion concentration; said treatment being carried out until the surface has a color tone (S) of:

$$s=(X^2+(3.388Z-3Y^2)^{1/2}\geq 70$$

wherein X, Y and Z represent the tristimulus values of color; and subjecting the aluminum material thus treated, to a further surface treatment.

BRIEF DESCRIPTION OF THE DRAWINGS

FIG. 1 shows the relationship between color tone (value S) and surface oxygen concentration.

DESCRIPTION OF THE PREFERRED EMBODIMENTS

In the present invention, the chelating agent refers to a polyvalent metal ion blocking agent, including aminopolycarboxylic acids such as EDTA (ethylenediaminetetraacetic acid), CyDTA (trans-1,2-cyclohexanediamine-N,N,N',N'-tetraacetic acid, GEDTA (glycoletherdiaminetetraacetic acid). DTPA (diethylenetriamine-N,N,N',N'',N''-pentaacetic acid), TTHA (triethylenetetramine-N,N,N',N''',N''''-hexaacetic acid), NTA (nitrilotriacetic acid), HEDTA (N-(2-hydroxyethyl) ethylenediamine-N,N',N''-triacetic acid, DCTA (trans-1,3-diaminocyclohexanetetraacetic acid, TPHA (tetraethylenepentamineheptaacetic acid) and EDTP (ethylenediaminetetrapropionic acid). This may preferably be a free aminopolycarboxylic acid or an alkali metal salt, as exemplified by a sodium salt, thereof. In the aqueous solution, the chelating agent must be in a concentration of 0.005 mol/lit. or more up to 1.0 mol/lit., and preferably from 0.03 to 0.3 mol/lit. Its use in a concentration less than 0.005 mol/lit. may make the effect of the chelating agent unsatisfactory, so that the etching action may become poor to cause a trouble that the oxide layer partly remains, resulting in no achievement of the color tone of $S\geq 70$. In addition, as the chelating agent is consumed, the aqueous solution may greatly deteriorate to make the operation unstable, so that the problems such as blackening, a poor adhesion of coatings and a poor anticorrosion may occur after the surface treatment. There is another problem that smuts tend to occur on the surface of the treated aluminum material to make it necessary to provide the step of desmutting. Its use in a concentration more than 1.0 mol/lit. may result in its no dissolution in solvent such as water.

The organic amine may include ethylenediamine, triethanolamine (TEA) and diethanolamine. It should be used in a concentration of 5 g/lit. or more, and preferably from 5 to 500 g/lit. Its use in a concentration of as low as less than 5 g/lit. can not be effective for its cooperative action with the chelating agent, so that the oxide layer may remain even after the surface treatment, resulting in no achievement of the color tone of $S\geq 70$ and inevitably bringing about the problems such as blackening, a poor adhesion of coatings and a poor anticorrosion. Its use in a concentration more than 500 g/lit. may make the solution too viscous to handle it with ease.

The surface treating solution used in the present invention can be prepared by dissolving the stated components in the stated concentration in a solvent such as water, according to a conventional method.

The surface treating solution must have 100 ppm or less of phosphoric acid radical ion concentration and 500 ppm or less of sulfuric acid radical ion concentration. Any presence of these ions in excess of the specified concentration may cause the blackening of the surface, resulting in no achievement of the color tone of $S\geq 70$.

To remove these anions so as to be not more than the stated concentration, it is preferable to use what is called pure water such as ion-exchanged water, or distilled water, or to use water from which they have been removed by adding an adsorbent.

There are no particular limitations on the pH of the surface treating solution. In view of handling simplicity and also an improvement in treatment performance, the solution may have a pH of from 4 to 11. The surface treating solution may also contain an alkaline substance as exemplified by an alkali metal hydroxide such as sodium hydroxide or potassium hydroxide or an alkaline earth metal hydroxide such as calcium hydroxide, or an acidic substance as exemplified by a mineral acid such as hydrochloric acid except sulfuric acid and phosphoric acid or a carboxylic acid such as citric acid. It may still also contain a surface active agent such as a nonionic surface active agent.

Treating the aluminum material surface with the aqueous surface treating solution containing the chelating agent in combination with the organic amine enables removal of the oxide layer in a short time. In this instance, no smuts may adhere to the surface and hence no desmutting is required, so that the process can be shortened. The treatment may be carried out by either dipping or spraying.

The treatment may be carried out at a temperature of from 30° C. to the boiling point, and there are no particular limitations. The temperature may be appropriately selected according to the relationship between the quantity of oxide layers of samples and the treating time. In view of treating time and handling properties, the treatment may preferably be carried out at from about 50° C. to about 90° C. The treatment time may be from several seconds (e.g., about 5 seconds) to about 30 minutes, and preferably from about 1 minute to 15 minutes. It may be appropriately set taking account of the concentration of the aqeous solution, the temperature, the pH and the quantity of oxide layers.

To measure the color tone S, a sample being surface-treated may be washed with water, followed by drying, and the X,Y,Z values may be determined using a color measuring device such as a colorimeter, where the value S can be calculated from the resulting values. The color measurement can be completed in several seconds or so. Thus, it has become possible to carry out a proper treatment without relying on intuition and without any excessive or insufficient treatment for the removal of oxide layers.

The aluminum material from which such a problematic surface oxide layer has been removed can be subjected to a step including hydration oxidation treatment, chromating, anodizing, alternating current electrolysis in an aqueous alkaline solution, anticorrosive coating material coating and so forth, which may be carried out alone or in combination of any of these.

The hydration oxidation treatment may be carried out by dipping the surface-treated aluminum material in, or spraying it with, deionized water of 50° C. or above. The deionized water may contain the oxidizing agent as disclosed in Japanese Patent Laid-open No. 59-211578. It may also contain the amine compound such as triethanolamine, as disclosed in Japanese Patent Laid-open No. 64-34731. The treatment time may be appropriately selected according to the relationship between the treatment bath temperature, the required film thickness and so forth. In usual instances, it may be set in the range of from about 1 minute to about 60 minutes. The deionized water may have a pH of from about 4 to about 11. A pH of less than 4 or more than 11 is undesirable since the film formation can be insufficient or no film can be formed.

The chromating may include several types. For example, in coating type chromating, its coating solution may contain $SiO_2$, a resin such as polyacrylic acid, a Zr salt, a Ti salt or the like. An aqueous solution containing $Cr^{6+}$ or $Cr^{3+}$ may also be used, which may be appropriately coated by roll coating, spraying or brushing. The coating weight may also be selected according to the purpose, and may usually be set in the range of from about 0.1 $g/m^2$ to about 5 $g/m^2$. In baking type chromating, baking may be applied as desired.

Phosphoric acid chromating may also be carried by the process as disclosed in British Patent Application No. 803, 405 (liquid temperature: 30° to 70° C.; bath composition: 100 to 5,000 ppm of fluoride ions, 0.01 to 2% of Cr ions and 0.1 to 7% of phosphate ions, in approximation, which may be appropriately selected). The coating weight may be appropriately selected, and may preferably be in the range of from 10 to 100 $mg/m^2$ as chromium weight.

Chromic acid chromating may also be carried out, e.g., by the Albond CRA process as disclosed in British Patent No. 240,623 (liquid temperature: 20° to 30° C.; treatment time: 2 to 3 minutes; bath composition; 9 g/lit. of chromic acid, 3.5 g/lit. of sodium tungstate and 4.5 g/lit. of sodium fluoride).

The anodizing may be carried out by electrolysis in an aqueous solution of sulfuric acid, oxalic acid, phosphoric acid, boric acid or the like. The film thickness may be selected according to the purpose, and may be set in the range of from about 0.1 to about 30 μm.

In the alternating current electrolysis in an aqueous alkaline solution, alternating current electrolysis may be carried out in the aqueous alkaline solution as disclosed in Japanese Patent Laid-open No. 63-258674 and Japanese Patent Laid-open No. 2-182900.

As the anticorrosive coating material coating, the acrylic resin coating as disclosed in Japanese Patent Laid-open No. 62-105629, the fluorine resin coating as disclosed in Japanese Patent Laid-open No. 2-74578, etc. can commonly bring about an improvement in anticorrosion, and there are no particular limitations thereon. The resin as the coating material may be coated and also optionally baked to thereby more improve the anticorrosion.

In the present invention, the method for measuring the color tone S by colorimetry is not a method of directly measure the quantity of oxide layers. It, however, reflects the quantity of oxide layers, and has been found to be utilizable as a control value when an appropriate value is given to the minimum value of the value S. The relationship between the quantity of oxide layers and the color tone value S can be seen to be $S \geq 70$ in the state the surface oxide layer has been removed (see FIG. 1). The treatment for removing oxide layers, carried out so as to provide such a surface, has been ascertained to make it possible to produce a surface-treated aluminum material having a good adhesion, a good anticorrosion and a good color change preventive properties.

In this case, in order to efficiently remove the surface oxide layers, the treatment for removing oxide layers is carried out using the aqueous solution containing the chelating agent. The chelating agent is capable of forming complex compounds with various types of metals to make surfaces stable, and hence the smuts can be prevented from occurring on the aluminum surface and the etching power can be maintained at a high level, so that the oxide layer can be removed in a short time. The material components eluted are formed into scales with difficulty because of the treatment with the chelating agent, so that baths, piping and so forth can be managed with ease.

The use of the chelating agent in combination with the organic amine such as triethanolamine has been found to enable improvement of the ability of the chelating agent for removing oxide layers. Addition of the amine in a concentration of less than 5 g/lit. may result in a low ability of removing oxide layers, to take a long time to carry out the treatment.

It also has been made clear that the presence of the sulfuric acid radicals and/or phosphoric acid radicals in the treating solution gives new formation of a black to yellow color coating in the course of the treatment, the formation of which is particularly remarkable in the case of Mg type aluminum alloys. Hence, these anions in the solution must be controlled so as to be in concentrations of 500 ppm or less and 100 ppm or less, respectively.

The adjustment of the pH by the addition of an alkali or an acid to the aqueous surface treating solution also brings about more improvement in treatment performance because of the etching effect attributable to its reaction with the alkali or acid in addition to the reaction of the chelating agent with aluminum. The addition of a surface active agent also enables effective removal of oily matter and improvement in the wettability of the reagent to the material, thus making it possible to improve treatment performance.

EXAMPLES

The present invention will be described below in greater detail by giving Examples.

Example 1

JIS A5182-H19 sheet materials were treated under conditions as shown in Table 1, using surface treating solutions containing EDTA.2Na salt, TEA, sulfuric acid radicals and phosphoric acid radicals as also shown in Table 1, followed by washing with water and then drying. The resulting surfaces were subsequently measured by colorimetry using a color computer SM-3, manufactured by Suga Shikenki K.K. to calculate values S from the X,Y,Z values. The sheet materials thus treated were further subjected to hydration oxidation treatment in ion-exchanged water at 100° C. for 10 minutes, followed by drying, and then similarly measured by colorimetry using the color computer SM-3 to calculate values S from the X,Y,Z values. The sheet material thus treated was subjected to an SST test (salt spray test) for 1,000 hours according to JIS Z2371-1988 to evaluate anticorrosion on the basis of corrosion area.

Results obtained are shown in Table 1.

Comparative Example 1

Using the same sheet materials as those in Example 1, the surface treatment was carried out in the same manner as in Example 1, but under conditions as shown in Table 1. Similarly, the measurement of color tones, the hydration oxidation treatment, the measurement of color tones of the resulting surfaces and then the SST test were carried out.

Results obtained are shown in Table 1.

Comparative Example 2

Using the same sheet materials as those in Example 1, the surface treatment was first carried out by alkali etching at 40° C. for 5 minutes using an aqueous 10% NaOH solution, or by weak alkali degreasing at 70° C. for 3 minutes using a sodium phosphate bath. The sheet materials thus treated were washed with water, followed by drying, and thereafter the color tones were measured in the same manner as in Example 1. Subsequently, the hydration oxidation treatment, the measurement of color tones and the SST test were also carried out in the same manner as in Example 1.

Results obtained are shown in Table 1.

According to Example 1, when the color tone (the value S) after treatment by the method of the present invention is 70 or more, the color tone do not become dark after the hydration oxidation treatment has been carried out, and it is possible to obtain white, highly anticorrosive coatings.

Example 2 & Comparative Example 3

JIS A5182-H32 sheet materials were treated using treating solutions and under conditions as shown in Table 2, followed by washing with water and then drying. The colorimetry was also carried out using the same color computer SM-3 as that in Example 1 to calculate values S from the X,Y,Z values.

The sheet materials thus treated were subsequently subjected to a boiling water test at 100° C. for 10 minute using city water, followed by drying. Then the colorimetry was again carried out and at the same time any changes in color tone of the appearance were visually observed. Visual evaluation was made according to a five-rank system in which no blackening occurred is regarded as "1", and blackening occurred most greatly, as "5".

Results obtained are shown in Table 2.

As is seen from the results, no blackening occurs and good color tones can be maintained even when the boiling water test was carried out without further surface treatment, so long as the value S is 70 or more.

Example 3 & Comparative Example 4

JIS A1200-H24 sheet materials were treated using treating solutions and under conditions as shown in Table 3, followed by washing with water and then drying. The colorimetry was also carried out in the same manner as in Example 1 to calculate values S from the X,Y,Z values.

Next, a coating type chromating solution (NRC-300, available from Nippon Paint Co., Ltd.) was coated in a coating thickness of 1 μm, followed by drying at 100° C. Thereafter, the resulting test pieces were dipped in 1,1,1-trichloroethane (ETHANA VG, trade name, available from Asahi Chemical Industry Co., Ltd.) at 74° C. for 10 minutes. Some of the resulting test pieces were dipped in an aluminum fin cleaner (Aluminum Fin Cleaner W, available from Seiwa Kogyo K.K.; diluted to 1/5; pH: 12–13) for 10 minutes and then washed with running water for 15 minutes. Setting these steps as one cycle, the treatment was carried out by 10 cycles, and thereafter a cross cut adhesion test (cross cuts: at intervals of 1 mm) was carried out. Others of the test pieces were subjected to an SST test for 2,000 hours according to JIS 2371-1988.

Results obtained are shown in Table 3.

As is seen therefrom, the surface-treated aluminum materials can have both good adhesion and good anticorrosion so long as the color tone value S after pretreatment is 70 or more.

Example 4 & Comparative Example 5

JIS A1100-H18 sheet materials were treated using treating solutions and under conditions as shown in Table 4, followed by washing with water and then drying. The colorimetry was also carried out in the same manner as in Example 1 to calculate values S from the X,Y,Z values.

Next, the resulting test pieces were anodized in an aqueous 15% by weight sulfuric acid solution at 20° C. at 1.5 A/dm$^2$ for 50 minutes, followed by washing with water and then drying. The test pieces thus treated were subjected to a CASS (copper-accelerated acetic acid salt spray) test for 2,000 hours according to JIS H8681-1988.

Results obtained are shown in Table 4.

As is seen therefrom, coatings with less defects and good anticorrosion can be formed by a one-stage treatment so long as the value S is 70 or more. Although relatively good coatings can be obtained also in the caustic etching-desmutting, this is a two-stage treatment having a low productivity.

Example 5 & Comparative Example 6

JIS A1100-H24 sheet materials were treated using treating solutions and under conditions as shown in Table 5, followed by washing with water and then drying. The colorimetry was also carried out in the same manner as in Example 1 to calculate values S from the X,Y,Z values.

Next, the resulting test pieces were subjected to alternating current electrolysis in a sodium phosphate type electrolytic solution under conditions of 8 A/dm$^2$ and 30 seconds.

Meanwhile, an epoxy resin for use in electrical insulation was coated on a 35 μm thick copper foil, followed by drying. This foil was superposed on the above surface-treated aluminum sheet materials each, which were then thermocompression-bonded under 392 N/cm$^2$ at 170° C. for 90 minutes. The resulting laminate sheets were subjected to a solder heat resistance test according to JIS C6481 to measure the time by which peeling occurred.

Results obtained are shown in Table 5.

Example 6 & Comparative Example 7

JIS A3004-H24 sheet materials were treated using treating solutions and under conditions as shown in Table 6, followed by washing with water and then drying. The colorimetry was also carried out in the same manner as in Example 1 to calculate values S from the X,Y,Z values.

Next, the resulting test pieces were coated with an acrylic resin (ESBIA AL-50B) in a coating thickness of 1 μm, followed by baking at 290° C. Then the resulting test pieces were dipped in 1,1,1-trichloroethane (ETHANA VG, trade name, available from Asahi Chemical Industry Co., Ltd.) at 74° C. for 10 minutes. Some of the resulting test pieces were dipped in an aluminum fin cleaner (Aluminum Fin Cleaner W, available from Seiwa Kogyo K.K.; diluted to 1/5; pH: 12–13) for 10 minutes and then washed with running water for 15 minutes. Setting these steps as one cycle, the treatment was carried out by 10 cycles, and thereafter a cross cut adhesion test (cross cuts: at intervals of 1 mm) was carried out. Others of the test pieces were subjected to an SST test for 2,000 hours according to JIS 2371-1988.

Results obtained are shown in Table 6.

TABLE 1

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Color tone after further teatment (S value) | SST test (Corrosion area) (%) |
|---|---|---|---|---|---|---|---|---|
| Example 1: | | | | | | | | |
| 0.01 | 10 | 5 | 10 | 40 | 16 | 73.1 | 86.0 | 0.03 |
| 0.05 | 40 | 0 | 1 | 60 | 15 | 115.3 | 91.4 | 0.03 |
| 0.10 | 100 | 80 | 400 | 90 | 1 | 117.1 | 103.3 | 0.01 |
| Comparative Example 1: | | | | | | | | |
| 0.02 | 10 | 5 | 10 | 90 | 15 | 30.3 | 50.3 | 2 |
| 0.10 | 0 | 5 | 10 | 60 | 15 | 59.0 | 63.7 | 5 |
| 0.30 | 10 | 900 | 2,500 | 40 | 15 | 57.4 | 64.7 | 4 |
| Comparative Example 2: | | | | | | | | |
| 10% NaOH (40° C., 5 min) | | | | | | 62.4 | 55.2 | 15 |
| Sodium phosphate degreasing (70° C., 3 min)* | | | | | | 42.4 | 41.4 | 25 |

*Aqueous 2% solution of SURFCLEANER 322-N8, trade name (Nippon Paint Co., Ltd.)

TABLE 2

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Color tone after boiling water test (S value) | Results of visual evaluation |
|---|---|---|---|---|---|---|---|---|
| Example 2: | | | | | | | | |
| 0.01 | 40 | 25 | 50 | 60 | 15 | 100.5 | 97.7 | 1 |
| 0.05 | 10 | 25 | 50 | 60 | 15 | 113.1 | 83.9 | 1 |
| 0.10 | 100 | 25 | 50 | 90 | 35 | 120.3 | 91.5 | 1 |
| Comparative Example 3: | | | | | | | | |
| 10% NaOH (60° C., 15 min) | | | | | | 60.4 | 31.2 | 5 |
| 30% Nitric acid (50° C., 5 min) | | | | | | 65.6 | 63.4 | 2 |
| MEK cleaning (room temp.) | | | | | | 47.0 | 43.9 | 4 |
| Control | | | | | | 50.4 | 50.2 | 3 |

TABLE 3

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Cross cut adhesion (Number) (per 100) | SST test (Corrosion area) (%) |
|---|---|---|---|---|---|---|---|---|
| Example 3: | | | | | | | | |
| 0.01 | 40 | 25 | 50 | 60 | 15 | 117.2 | 100/100 | 0 |
| 0.05 | 10 | 25 | 50 | 60 | 15 | 118.7 | 100/100 | 0 |
| 0.10 | 100 | 25 | 50 | 90 | 15 | 116.5 | 100/100 | 0 |
| Comparative Example 4: | | | | | | | | |

TABLE 3-continued

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Cross cut adhesion (Number) (per 100) | SST test (Corrosion area) (%) |
|---|---|---|---|---|---|---|---|---|
| Alkali degreasing (pH 13.5. 70° C., 60 sec) | | | | | | 55.7 | 33/100 | 25 |

TABLE 4

| EDTA.2Na (mol/l) | TEA (g/l) | $PO_4^{3-}$ (ppm) | $SO_4^{2-}$ (ppm) | Temp. (°C.) | Time (min) | Color tone after pretreatment (S value) | CASS test (Corrosion area)(%) |
|---|---|---|---|---|---|---|---|
| Example 4: | | | | | | | |
| 0.03 | 20 | 0 | 0 | 90 | 3 | 114.1 | 0.07 |
| 0.05 | 40 | 0 | 0 | 60 | 5 | 117.6 | 0.05 |
| 0.10 | 30 | 0 | 0 | 90 | 1 | 121.7 | 0.03 |
| Comparative Example 5: | | | | | | | |
| Caustic etching → nitric acid desmutting | | | | | | 65.2 | 0.1 |
| Caustic etching (60° C., 15 min, 10° C.) | | | | | | 60.8 | 3 |

TABLE 5

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Time until peeling occurs Moisture absorbing treatment* | |
|---|---|---|---|---|---|---|---|---|
| | | | | | | | None | Applied |
| Example 5: | | | | | | | | |
| 0.01 | 10 | 0 | 0 | 90 | 15 | 86.3 | >10 min | >100 min |
| 0.05 | 40 | 0 | 0 | 90 | 5 | 220.3 | " | " |
| 0.10 | 100 | 0 | 0 | 90 | 1 | 117.1 | " | " |
| Comparative Example 6: | | | | | | | | |
| Control | | | | | 56.4 | | 7 min | 6 min |

*Moisture absorbing treatment was carried out in 120° C. vapor under pressure, for 16 hours.

TABLE 6

| EDTA.2Na (mol/l) | TEA (g/l) | $PO_4^{3-}$ (ppm) | $SO_4^{2-}$ (ppm) | Temp. (°C.) | Time (min) | Color tone after pre-treatment (S value) | Cross cut adhesion (Number) (per 100) | SST test (Corrosion area) (%) |
|---|---|---|---|---|---|---|---|---|
| Example 6: | | | | | | | | |
| 0.02 | 100 | 0 | 0 | 90 | 15 | 97.2 | 100/100 | 0 |
| 0.06 | 50 | 0 | 0 | 40 | 15 | 114.3 | 100/100 | 0 |
| 0.10 | 100 | 0 | 0 | 90 | 3 | 119.5 | 100/100 | 0 |
| Comparative Example 7: | | | | | | | | |
| Alkali degreasing (pH 13.5, 70° C., 60 sec) | | | | | | 58.5 | 70/100 | 5 |

As described above, the present invention is based on the discovery that the treatment conditions having been hitherto relied on experience and intuition can be properly set according to the colorimetry that enables simple, quick and non-destructive measurement, and has accomplished the setting of conditions therefor together with the proposal on the composition for an effective treating solution.

The treatment of aluminum materials by the use of the present treating solution is not only a treatment effective for the anticorrosive treatment for itself, but also a very effective pretreatment substituting for various pretreatments conventionally known.

That is, the colorimetry can be carried out non-destructively, with ease and in a short time using the color measuring device such as a colorimeter. The colorimetry using the color computer SM-3, manufactured by Suga Shikenki K.K., can be carried out in several seconds per measurement, and as a matter of course the measurement can be carried out in the atmosphere. This is decisively advantageous over the measurement by SEM, TEM, EPMA, XPS (X-ray photoelectron spectroscopy) or the like. Machinery for these can output correct values with ease, but requires a vacuum environment, can perform non-destructive examination with difficulty in the case of samples with a large size and takes a long time for the measurement. On the other hand, the values used in the present invention can be well useful even if they are relative values.

The surface treatment using the treating solution of the present invention can achieve complete removal of surface oxide layers in a short time, may cause no smuts to make the desmutting unnecessary, enables easy management of baths and piping, can provide surface-treated aluminum materials having a good anticorrosion and a good surface appearance even by this treatment only, and also enables formation of coatings excellent in uniformity, prevention of color changes, adhesion, solvent resistance and anticorrosion when used in combination as the anticorrosive pretreatment such as hydration oxidation treatment, chromating, anodizing, alternating current electrolysis in an aqueous alkaline solution, anticorrosive resin coating and so forth.

What is claimed is:

1. A method of treating the surface of an aluminum or aluminum alloy material to remove the oxide from said surface, comprising subjecting said material to a surface treatment with an aqueous solution containing at least 0.005 mol/lit. of a polyvalent metal ion blocking agent and at least 5 g/lit. of an organic amine and having no more than 100 ppm of phosphoric acid radical ion and no more than 500 ppm of sulfuric acid radical ion; and measuring the tristimulus values of color from an aluminum or aluminum alloy material that is being treated with said aqueous solution, said treatment being ended when the surface has a color tone (S) of:

$$S=(X^2+(3.388Z-3Y)^2)^{1/2} \geq 70$$

wherein X, Y and Z represent the tristimulus values of color.

2. The method according to claim 1, wherein said polyvalent metal ion blocking agent is contained in an amount of from 0.005 mol/lit. to 1.0 mol/lit.

3. The method according to claim 1, wherein said polyvalent metal ion blocking agent is an aminopolycarboxylic acid selected from the group consisting of ethylenediaminetetraacetic acid, trans-1,2-cyclohexanediamine-N,N,N',N'-tetraacetic acid, glycoletherdiaminetetraacetic acid, diethylenetriamine-N,N,N',N'',N''-pentaacetic acid, triethylenetetramine-N,N,N',N''',N'''-hexaacetic acid, nitrilotriacetic acid, N-(2-hydroxyethyl) ethylenediamine-N,N',N''-triacetic acid, trans-1,3-diaminocyclohexanetetraacetic acid, tetraethylenepentaminoheptaacetic acid and ethylenediaminetetrapropionic acid, or an alkali metal salt of any of these.

4. The method according to claim 3, wherein said polyvalent metal ion blocking agent is disodium ethylenediaminetetraacetate.

5. The method according to claim 1, wherein said organic amine is contained in an amount of from 5 g/lit. to 500 g/lit.

6. The method according to claim 1, wherein said organic amine is selected from the group consisting of ethylenediamine, triathanolamine and diethanolamine.

7. The method according to claim 6, wherein said organic amine is triethanolamine.

8. The method according to claim 1, wherein said aqueous solution has a pH of from 4 to 11.

9. The method according to claim 1, wherein said surface treatment is carried out at a temperature of from 30° C. to the boiling point for from about 5 seconds to about 30 minutes.

10. The method according to claim 9, wherein said surface treatment is carried out at a temperature of from 50° C. to 90° C. for 1 minute to 15 minutes.

11. The method according to claim 1, wherein said color tone is measured by means of a colorimeter.

12. A method of treating the surface of an aluminum or aluminum alloy material to remove the oxide from said surface, comprising subjecting said material to a surface treatment with an aqueous solution containing at least 0.005 mol/lit. of a polyvalent metal ion blocking agent and at least 5 g/lit. of an organic amine and having no more than 100 ppm of phosphoric acid radical ion and no more than 500 ppm of sulfuric acid radical ion; and measuring the tristimulus values of color from an aluminum or aluminum alloy material that is being treated with said aqueous solution, said treatment being ended when the surface has a color tone (S) of:

$$S=(X^2+(3.388Z-3Y)^2)^{1/2} \geq 70$$

wherein X, Y and Z represent the tristimulus values of color; and subjecting the aluminum material thus treated, to a further surface treatment.

13. The method according to claim 12, wherein said further surface treatment is hydration oxidation treatment, chromating, anodizing, alternating current electrolysis in an aqueous alkaline solution or anticorrosive coating material coating, or a combination of any of these.

14. The method according to claim 12, wherein said polyvalent metal ion blocking agent is contained in an amount of from 0.005 mol/lit. to 1.0 mol/lit.

15. The method according to claim 12, wherein said polyvalent metal ion blocking agent is an aminopolycarboxylic acid selected from the group consisting of ethylenediaminetetraacetic acid, trans-1,2-cyclohexanediamine-N,N,N',N'-tetraacetic acid, glycoletherdiaminetetraacetic acid, diethylenetriamine-N,N,N',N'',N''-pentaacetic acid, triethylenetetramine-N,N,N',N''',N'''-hexaacetic acid, nitrilotriacetic acid, N-(2-hydroxyethyl) ethylenediamine-N,N',N''-triacetic acid, trans-1,3-diaminocyclohexanetetraacetic acid, tetraethylenepentaminoheptaacetic acid and ethylenediaminetatrapropionic acid, or an alkali metal salt of any of these.

16. The method according to claim 15, wherein said polyvalent metal ion blocking agent is disodium ethylenediaminetetraacetate.

17. The method according to claim 12, wherein said organic amine is contained in an amount of from about 5 g/lit. to about 500 g/lit.

18. The method according to claim 12, wherein said organic amine is selected from the group consisting of ethylenediamine, triethanolamine and diethanolamine.

19. The method according to claim 16, wherein said organic amine is triethanolamine.

20. The method according to claim 12, wherein said aqueous solution has a pH of from 4 to 11.

21. The method according to claim 12, wherein said surface treatment is carried out at a temperature of from 30° C. to the boiling point for from about 5 seconds to about 30 minutes.

22. The method according to claim 21, wherein said surface treatment is carried out at a temperature of from 50° C. to 90° C. for 1 minute to 15 minutes.

23. The method according to claim 12, wherein said color tone is measured by means of a colorimeter.

\* \* \* \* \*